INVENTORS
HITOHIRO FUKUYO
NORIO TABUCHI
BY
Blum, Moscovitz, Friedman, Blum & Kaplan
ATTORNEYS INVENTORS
HITOHIRO FUKUYO
NORIO TABUCHI
BY
Blum, Moscovitz, Friedman, Blum & Kaplan
ATTORNEYS United States Patent Office 3,435,368
Patented Mar. 25, 1969

3,435,368
LOW FREQUENCY PIEZOELECTRIC CRYSTAL OSCILLATOR HAVING A SINGLE DRIVING CIRCUIT

Hitohiro Fukuyo, Tokyo, and Norio Tabuchi, Chiba-shi, Chiba-ken, Japan, assignors to Kabushiki Kaisha Hattori Tokeiten, Tokyo, Japan, a corporation of Japan Filed Oct. 22, 1965, Ser. No. 501,111
Claims priority, application Japan, Mar. 6, 1965, 40/12,868
Int. Cl. H03b *21/02*
U.S. Cl. 331—37 10 Claims

ABSTRACT OF THE DISCLOSURE

A stable low-frequency crystal oscillator signal generator having a piezoelectric crystal, an oscillator circuit adapted to generate a plurality of characteristic frequencies in said crystal, said oscillator circuit including two selectively tuneable resonant circuits tuned to select two of said crystal characteristic frequencies, and detector means connected across the output of said oscillator circuit to derive the beat frequency signal of said selected crystal resonant frequency signals.

This invention relates to a crystal oscillator and more particularly to a stable low-frequency crystal oscillator signal generator.

Piezoelectric crystals such as quartz crystals have found extensive application in radio apparatus such as transmitters and receivers where a high degree of frequency stability, particularly over long periods of time is required. The frequency stability features of such crystals have been utilized by replacing the usual resonant circuit of an oscillator with a mechanically vibrating piezoelectric crystal and making use of the piezoelectric effect to interconnect the resonant vibration of the crystal with the electric circuitry.

The crystal resonant frequency is a function of the crystal mechanical dimensions, mode of vibration, i.e., longitudinal, flexural or shear, and the elastic constants of the crystal for the particular mode, which determines the elastic couplings between the various vibrational modes. Each type of vibration can exist in a fundamental and overtone, i.e., harmonic mode with the activity of the crystal being progressively less the higher the overtone. Frequencies as high as 100 mc. have been obtained with crystals having an AT cut, ranging down to frequencies of about 50 kc. for the flexural vibration mode of the NT cut crystals.

Because of the relatively high frequency of the characteristic resonant modes of typical piezoelectric crystals the feature of frequency stability provided by crystals has heretofore been largely confined to signal generators outside the low frequency range.

Hitherto, to obtain frequencies in the low frequency band, i.e., 1–50 kc., crystals having a flexural mode of vibration such as those of the NT cut type have been utilized, or alternately high frequency AT cut type crystals have been employed and the desired frequency obtained by means of frequency dividers. It has been found, however, that the frequency stability is inherently lower in the flexural or longitudinal vibration modes characteristic of the lower frequency cuts such as the NT or MT cut type crystals. Frequency stability has also been found to be impaired by the use of frequency divider circuits with AT-cut crystals because of the instability introduced by its complicated circuitry and the inherent inaccuracies due to changes with time in the values of the divider circuit components.

Further problems encountered in the techniques heretofore employed are the expected variations in crystal resonant frequency and in crystal activity with use, this process being known as aging, and crystal resonant frequency variations with temperature.

The present invention is directed to the solution of the above-mentioned problems to provide a low frequency generator which is stable and precise, and whose output frequency is substantially independent of variations in the constant of the electrical circuit elements due to aging or ambient temperature variation.

An important feaure of the present invention is the provision of a crystal oscillator circuit comprising a single crystal having a particular cutting angle and dimensions, which is operative to produce in a single vibrational mode, at least two preselected crystal resonant frequencies. The preselected crystal resonant frequencies typically comprise the fundamental resonant mode and a plurality of overtones.

In accordance with the principles of the present invention, in a crystal oscillator circuit an alternating voltage is applied across a piezoelectric crystal to produce signals at the fundamental mode and overtone resonant frequencies of said crystal. A driving circuit having a pair of selectively tunable resonant circuits is provided which is operative to select the fundamental and an overtone frequency signal of said crystal, and to mix the two signals and detect the envelope pulsation thereof, to thereby produce a low-frequency beat frequency signal corresponding to said selected crystal frequencies.

The novel features believed to be characteristic of this invention are set forth with particularity in the appended claims. The invention itself, however, both as to its organization and method of operation together with further objects and advantages thereof may best be understood by reference to the following description taken in connection with the accompanying drawings wherein:

Figure 1:
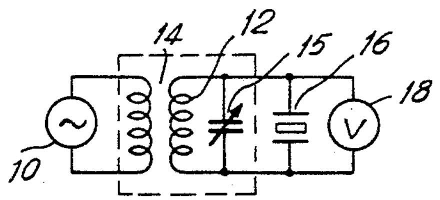
FIG. 1 shows a schematic diagram of a crystal resonance test circuit.
Figure 2:
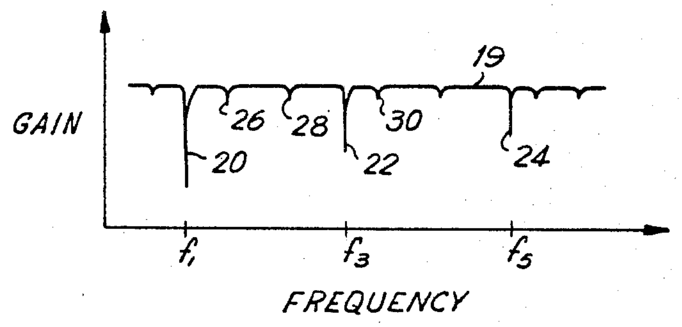
FIG. 2 shows the frequency response characteristic of the crystal shown in FIG. 1.

In FIG. 1 there is shown a crystal resonance test circuit having a test oscillator 10 driving a parallel resonant circuit comprising secondary winding 12 of transformer 14 and a variable tuning capacitor 15 across which is connected a piezoelectric crystal 16 under test. The frequency response of crystal 16 may be suitably monitored by a vacuum tube voltmeter 18 connected thereacross, to provide a frequency response characteristic as shown in FIG. 2. The salient points on frequency response characteristic 19 are indicated by the inverse peaks thereon of which 20 indicates the fundamental frequency or $f_1$, 22 and 24, the 3rd and 5th overtones, i.e., frequencies $f_3$ and $f_5$ respectively and 26, 28, 30 the submode vibration frequencies.

Figure 3:
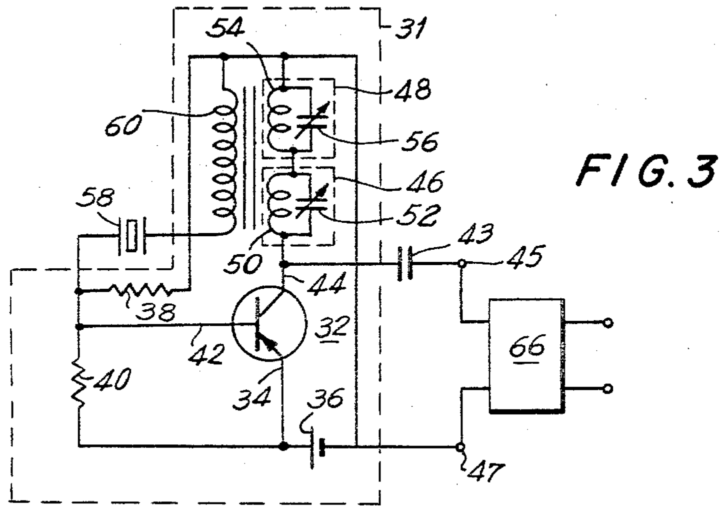
FIG. 3 shows a schematic diagram of an embodiment of the present invention in a tuned collector oscillator circuit.
Figure 4:
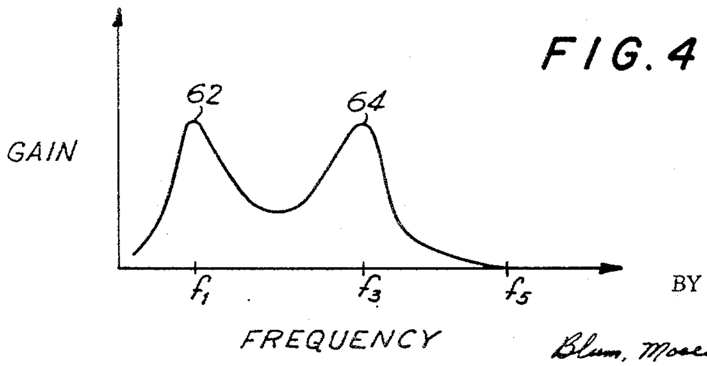
FIG. 4 shows the frequency response characteristic of the crystal driving circuit portion of the circuit shown in FIG. 3.

FIG. 3 shows a collector tuned oscillator utilizing the principles of the invention and comprises a crystal driving circuit 31 including a transistor 32 having its emitter 34 connected to the positive terminal of D.C. source 36. A pair of serially connected resistors 38 and 40 are connected across source 36 with the junction of said resistors being connected to base 42. In the circuit of collector 44 there are connected in serial arrangement a pair of parallel tuned resonant circuits 46 and 48, comprising winding 50 with variable capacitor 52 and winding 54 with variable capacitor 56 respectively, the end of tuned circuit 48 being connected to the negative terminal of source 36. Crystal 58 is connected at one of its end terminals to base 42 and at its other end terminal to winding 60, winding 60 being connected at its other end to the negative terminal of source 36 and is electromagnetically coupled to tuned circuits 46 and 48. The frequency response characteristic obtained from driving circuit 31 is shown in FIG. 4 where peaks 62 and 64, i.e., frequencies $f_1$ and $f_3$, correspond to the parallel resonant frequencies of tuned circuits 46 and 48. An output coupling capacitor 43 is connected to collector 44 and input terminal 45 of a known detector 66 which is operative to recover from a modulated wave a signal that varies in accordance with the modulation present on the wave. The other detector input terminal 47 is connected to the negative terminal of source 36.

The tuned circuit frequencies 62 and 64 can be selected to correspond respectively to the fundamental mode frequency 20 and the 3rd overtone 22 of crystal 58 shown in FIG. 2 by suitably varying capacitors 52 and 56. Accordingly, driving circuit 31 is operative to select two predetermined crystal resonant frequencies and suitably mix these signals to produce a waveform whose envelope pulsations have a frequency corresponding to the beat frequency of the two selected crystal frequencies. Typically, the frequencies selected are the fundamental mode $f_1$ and the third overtone $f_3$ but it is understood that other overtones may be selected as the mixing signals merely by suitably varying capacitors 52 and 56. In effect, the loop gain of driving circuit 31 becomes more than 1 simultaneously at the selected frequencies $f_1$ and $f_3$.

By way of illustration of the above, assume that crystal 58 is of the rectangular AT cut type which has a length $X_0$ in the direction of the electric axis and a thickness $Y_0$. In this case the relationship between the third overtone frequency $f_3$ and the fundamental frequency $f_1$ is given by the formula $$f_3=3f_1\left[1-\frac{4}{9}\frac{C_{11}}{C_{66}}\left(\frac{Y_0}{X_0}\right)^2\right] \quad (1)$$

where $C_{11}$ and $C_{66}$ are the coefficients of elasticity of crystal 58 for the high frequency shear vibrational mode. Accordingly, if one period of the fundamental frequency waveform is mixed with three periods of the third overtone waveform there will be produced a beat frequency which is represented by the relationship $$f_1-\frac{f_3}{3}=\frac{4}{9}\frac{C_{11}}{C_{66}}\left(\frac{Y_0}{X_0}\right)^2 f_1 \quad (2)$$

Accordingly, if crystal 58 has a thickness $Y_0=X_0/20$ the frequency of the beat signal will be substantially equal to $1/300$ of the frequency of the fundamental mode wave. Since the beat signal is derived by mixing one period of the fundamental wave with three periods of the third overtone the beat frequency signal will be three phase with each phase 120 degrees apart from its adjacent phase. Although the analysis above pertains to an AT cut type crystal it is understood that a similar analysis is applicable to crystals of other types such as the DT cut type crystal.

Figure 5:
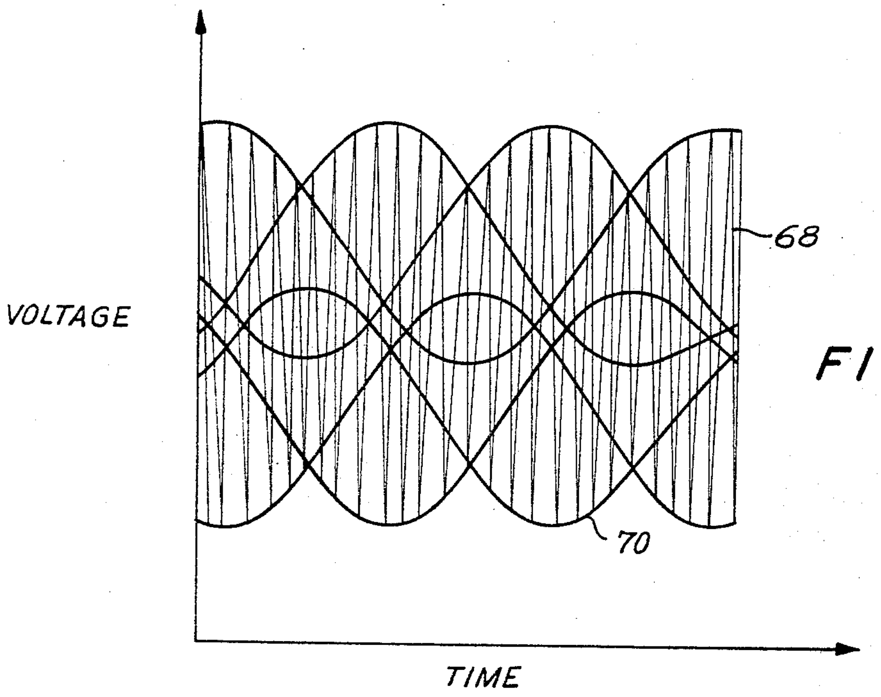
FIG. 5 shows an output wave form typically obtainable from the circuits shown in FIGS. 3 and 6.

FIG. 5 shows the waveforms obtainable by the circuit of FIG. 3 at terminals 45 and 47 wherein the fundamental mode waveform 68 has an envelope pulsation 70 i.e., beat waveform whose frequency is shown by Equation 2 above.

Envelope detection methods are well known in the art and accordingly a suitable detector 66 may be connected across the output terminals 45 and 47 of crystal driving circuit 31 to provide a waveform corresponding to envelope pulsation 70.

Figure 6:
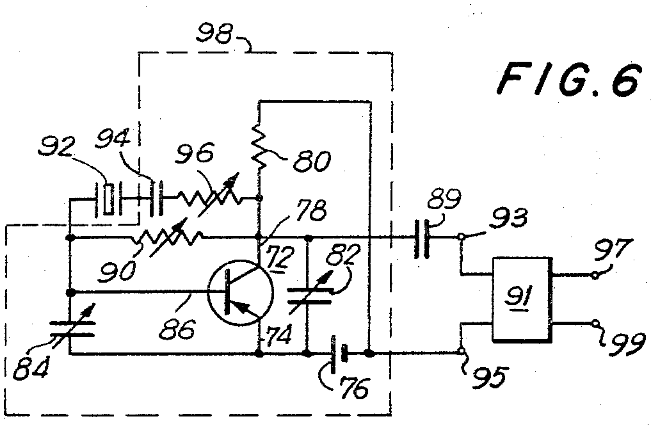
FIG. 6 shows a schematic diagram of an embodiment of the present invention in a Colpitts type oscillator circuit.

The technique described above is not restricted to a crystal driving circuit of the tuned collector type as shown in FIG. 3 but may be utilized in other crystal oscillator type circuits such as tuned emitter, Hartley or the Colpitts types, an example of its application in the Colpitts type oscillator being shown in FIG. 6.

In FIG. 6 there is shown a crystal driving circuit 98 comprising a transistor 72 having its emitter 74 connected to the positive terminal of D.C. source 76 and its collector 78 connected through resistor 80 to the negative terminal of D.C. source 76. A variable capacitor 82 is connected between emitter 74 and collector 78 and another variable capacitor 84 interconnects emitter 74 and base 86. Base 86 is connected to collector 78 by a parallel arrangement of a variable resistor 90 and a circuit in parallel therewith comprising crystal 92, capacitor 94 and variable resistor 96 all in serial arrangement. The output of the oscillator may be taken across one end of coupling capacitor 89 and the negative terminal of D.C. source 76 to be fed to any suitable detector 91, well known in the art, which is operative to detect the envelope of the composite waveform appearing at terminals 93 and 95.

Figure 7:
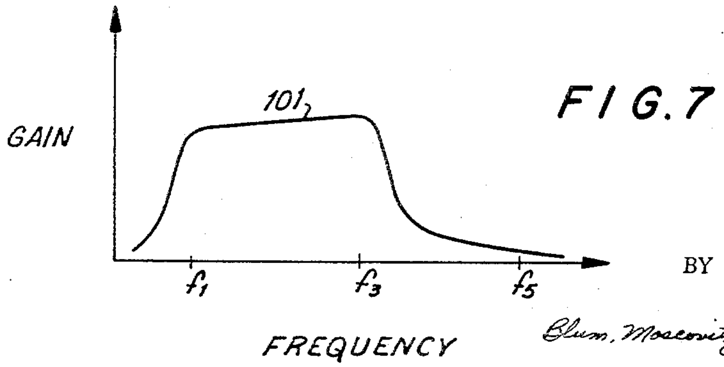
FIG. 7 shows the frequency response characteristic of the crystal driving circuit portion of the circuit shown in FIG. 6.

Waveform 101 in FIG. 7 indicates a typical frequency response characteristic of driving circuit 98, which shows a broad band resonant frequency spectrum extending substantially from the crystal fundamental resonant frequency $f_1$ to the third overtone frequency $f_3$ and tapering off towards zero at the fifth overtone frequency $f_5$. This frequency response characteristic may be obtained by adjusting resistor 90 to provide a suitable operating point for transistor 72 and by selecting the proper values for variable capacitors 82 and 84. Variable resistor 96 and capacitor 94 control the exciting current to crystal 92 and, accordingly, if suitably adjusted, driving circuit 98 is operative to simultaneously select both the fundamental resonant frequency of crystal 92 and its third overtone and to provide the beat signal thereof which is detected by detector 91. Driving circuit 98 is operative because the loop gain becomes more than 1 simultaneously in the selected frequencies $f_1$ and $f_3$. The waveforms obtainable by the Colpitts type of oscillator shown in FIG. 6 are similar to those produced by the tuned collector oscillator shown in FIG. 3 and is indicated in FIG. 5.

As in the case of the tuned collector type embodiment shown in FIG. 3, the envelope pulsation 70 represents the beat frequency waveform and may suitably be detected by a detector which is operative to demodulate the waveform appearing at terminals 93 and 95 to produce a low frequency signal at the output terminals 97 and 99.

While the above described circuits constitute particular embodiments of the invention, it will be understood that it is not wished to be limited thereto since modifications can be made both in the circuit arrangement and in the instrumentalities employed.

What is claimed as new and desired to be secured by Letters Patent of the United States is:

1. A method for providing a stable low frequency signal consisting of, in an oscillator circuit, applying an alternating voltage across a piezoelectric crystal to produce signals at the plurality of characteristic resonant frequencies of said crystal, selecting the fundamental frequency and an overtone of said fundamental frequency from said resonant frequency signals by making the loop gain of said oscillator circuit more than one simultaneously in said two selected frequencies, mixing said selected crystal resonant frequency signals to produce a signal representing the sum of said selected resonant frequency signals and detecting the envelope pulsation of said sum signal to produce a stable low frequency beat signal.

2. A method as defined in claim 1 wherein another of said plurality of crystal resonant frequencies is an odd overtone of said fundamental resonant frequency of said crystal.

3. A signal generator comprising a piezoelectric crystal, oscillator circuit means having frequency selection means, said oscillator circuit means being connected to said crystal and cooperative therewith to produce a signal characterized by the fundamental frequency and at least one overtone frequency characteristic of said crystal, said frequency selection means being operative to select two of said crystal characteristic frequencies, at least one of said selected frequencies being said overtone frequency, said oscillator circuit means mixing said selected frequency signals, and detector means connected across the output of said oscillator circuit means to thereby derive the beat frequency signal of said selected crystal resonant frequency signals.

4. A signal generator as defined in claim 3 wherein said frequency selection means comprises two selectively tunable resonant circuits.

5. A signal generator as defined in claim 4 wherein one of said resonant circuits is tuned to a frequency substantially equal to the fundamental mode resonant frequency of said crystal.

6. A signal generator as defined in claim 5 wherein the other of said resonant circuits is tuned to a frequency substantially equal to an odd overtone of said crystal.

7. A signal generator as defined in claim 3 wherein said preselected frequencies comprise overtones of the fundamental resonant frequency of said crystal.

8. A signal generator comprising a piezoelectric crystal having a pair of terminals, a D.C. source, oscillator circuit means comprising a transistor having its emitter connected to one terminal of said D.C. source, a pair of serially connected selectively tunable parallel L–C resonant circuits one end of one of said tunable resonant circuits being connected to the collector of said transistor and one end of the other of said resonant circuits being connected to the other terminal of said D.C. source, a pair of serially connected resistors connected across said D.C. source with the junction of said resistors being connected to the base of said transistor, and a winding in electromagnetic coupling relationship with said pair of resonant circuits, said winding being connected at one of its ends to said one end of the other of said resonant circuits and at its other end to one of said crystal terminals, the other of said crystal terminals being connected to said base electrode, said resonant circuits being respectively tuned to two of the characteristic resonant frequencies of said crystal, detector means, and a coupling capacitor connected between said collector and said detector means, said detector means being operative to detect the envelope of the waveform appearing at said collector.

9. A signal generator comprising a piezoelectric crystal having a pair of terminals; a D.C. source; oscillator circuit means comprising a transistor having its emitter connected to one terminal of said D.C. source; a first resistor interconnecting the collector of said transistor and the other terminal of said D.C. source; a first variable tuning capacitor connected between the collector and emitter of said transistor, a second variable tuning capacitor connected between the base and emitter of said transistor; said first and second variable tuning capacitors being respectively operative to select two characteristic resonant frequencies of said piezoelectric crystal; a second variable resistor connected between said base and said collector; a series combination connected between said base and said collector said series combination comprising said piezoelectric crystal, a third capacitor and a third variable resistor all in serial arrangement, said third variable resistor and said third capacitor being operative to control the exciting current to said piezoelectric crystal; detector means; and a fourth capacitor connected between said collector and said detector means, said detector means being operative to detect the envelope of the waveform appearing at said collector.

10. A signal generator comprising a D.C. source, a piezoelectric crystal, oscillator circuit means having frequency selection means and including a transistor having its emitter connected to one terminal of said D.C. source, a pair of serially connected selectively tunable parallel L–C resonant circuits one end of one of said tunable resonant circuits being connected to the collector of said transistor and one end of the other of said resonant circuits being connected to the other terminal of said D.C. source, said oscillator circuit means being connected to said crystal and cooperative therewith to produce a signal characterized by the fundamental frequency and at least one overtone frequency characteristic of said crystal, said frequency selection means being operative to select two of said crystal characteristic frequencies, at least one of said selected frequencies being said overtone frequency, said oscillator circuit means mixing said selected frequency signals, and detector means connected across the output of said oscillator circuit means to thereby derive the beat frequency signal of said selected crystal resonant frequency signals.

References Cited

UNITED STATES PATENTS

| | | | |
|---|---|---|---|
| 1,559,116 | 10/1925 | Marrison | 331—37 |
| 1,788,219 | 1/1931 | White | 331—37 X |
| 1,866,267 | 7/1932 | Nicolson | 331—37 |
| 2,448,188 | 8/1948 | Morrison | 331—37 |
| 3,108,223 | 10/1963 | Hunter | 331—116 X |
| 3,233,192 | 2/1966 | Smith | 331—116 X |
| 3,251,007 | 5/1966 | Schmitt | 331—116 |

ROY LAKE, *Primary Examiner.*

JAMES B. MULLINS, *Assistant Examiner.*

U.S. Cl. X.R.

331—74, 116, 164